US009464351B2

(12) United States Patent
Yoon et al.

(10) Patent No.: US 9,464,351 B2
(45) Date of Patent: Oct. 11, 2016

(54) METHOD OF FABRICATING LIGHT-SCATTERING SUBSTRATE

(71) Applicant: CORNING PRECISION MATERIALS CO., LTD., Gumi-si, Gyeongsangbuk-do (KR)

(72) Inventors: Gun Sang Yoon, Asan-si (KR); Hyun Bin Kim, Asan-si (KR); June Hyoung Park, Asan-si (KR)

(73) Assignee: CORNING PRECISION MATERIALS CO., LTD., Asan-Si, Chungcheongnam-Do ( * ) Notice: Subject to any disclaimer, the term of this patent is extended or adjusted under 35 U.S.C. 154(b) by 0 days.

(21) Appl. No.: 14/294,868

(22) Filed: Jun. 3, 2014

(65) Prior Publication Data
US 2014/0356527 A1      Dec. 4, 2014

(30) Foreign Application Priority Data

Jun. 4, 2013  (KR) .................. 10-2013-0064080

(51) Int. Cl.
*C23C 16/00* (2006.01)
*C23C 16/40* (2006.01)
*H01L 51/52* (2006.01)

(52) U.S. Cl.
CPC ......... *C23C 16/405* (2013.01); *H01L 51/5268* (2013.01)

(58) Field of Classification Search
CPC ...... C23C 16/405; C23C 16/40; C23C 16/00
USPC .................................................... 427/248.1
See application file for complete search history.

(56) References Cited

U.S. PATENT DOCUMENTS

| 2007/0059942 A1* | 3/2007 | Hu et al. ....................... 438/763 |
| 2008/0112880 A1* | 5/2008 | Kayama et al. .............. 423/610 |
| 2014/0030830 A1* | 1/2014 | Lee ...................... H01L 51/5268 438/29 |
| 2014/0042476 A1* | 2/2014 | Yoo ....................... H01L 33/405 257/98 |

FOREIGN PATENT DOCUMENTS

JP       2003-327432 A  *  3/2003

OTHER PUBLICATIONS

Gordon, Roy, Chemical vapor deposition of coatings on glass, Journal of Non-Crystalline Solids 218 (1997) pp. 81-91.*
Pazoki et al. CVD-grown TiO2 particles as light scattering structures in dye-sensitized solar cells, RSC Advances, 2012, 2 12278-12285.*

* cited by examiner

*Primary Examiner* — Kelly M Gambetta
(74) *Attorney, Agent, or Firm* — McDermott Will & Emery LLP

(57) ABSTRACT

A method of fabricating a light-scattering substrate, a light-scattering substrate fabricated by the same method, and an organic light-emitting device (OLED) including the same light-scattering substrate, in which a light-scattering layer of the light-scattering substrate can improve a light extraction efficiency. The method fabricates the light-scattering substrate by chemical vapor deposition, and includes loading a base substrate into a chamber, and forming a light-scattering layer on the base substrate by supplying a Ti source and an oxidizer including $H_2O$ into the chamber. In the process of forming the light-scattering layer, the mole ratio of the $H_2O$ with respect to the Ti is 10 or greater.

7 Claims, 2 Drawing Sheets

METHOD OF FABRICATING LIGHT-SCATTERING SUBSTRATE

CROSS REFERENCE TO RELATED APPLICATION

The present application claims priority from Korean Patent Application Number 10-2013-0064080 filed on Jun. 4, 2013, the entire contents of which are incorporated herein for all purposes by this reference.

BACKGROUND OF THE INVENTION

1. Field of the Invention

The present invention relates to a method of fabricating a light-scattering substrate, a light-scattering substrate fabricated by the same method, and an organic light-emitting device (OLED) including the same light-scattering substrate, and more particularly, to a method of fabricating a light-scattering substrate, a light-scattering substrate fabricated by the same method, and an organic light-emitting device including the same light-scattering substrate, in which a light-scattering layer of the light-scattering substrate can improve a light extraction efficiency.

2. Description of Related Art

Organic light-emitting devices (OLEDs), such as organic light-emitting diodes, are self-light-emitting devices each of which has a light-emitting layer situated between two electrodes. Specifically, OLEDs emit light in response to the transition of excitons from an excited state into a ground state. The excitons are generated through the combination of electrons injected through a cathode, or an electron injection electrode, and holes injected through an anode, or an hole injection electrode. OLEDs can have a double-layer structure which includes a hole transport (injection) layer and an electron transporting light-emitting layer or a triple-layer structure which includes a hole transport (injection) layer, a light-emitting layer and an electron transport (injection) layer.

Organic light-emitting displays each including OLEDs are divided into a passive matrix type and an active matrix type depending on the mechanism that drives an N*M number of pixels which are arranged in the shape of a matrix.

In the active matrix type, a pixel electrode which defines a light-emitting area and a unit pixel driving circuit which applies a current or voltage to the pixel electrode are positioned in a unit pixel area. The unit pixel driving circuit has at least one thin-film transistor (TFT) and one capacitor. Due to this configuration, the unit pixel driving circuit can supply a constant current regardless of the number of pixels, thereby realizing uniform luminance. In addition, the active matrix type organic light-emitting display consumes little power, and thus can be advantageously applied to high definition displays and large displays. The passive matrix type has a simpler structure than the active matrix type since it induces a current directly to each pixel. However, the passive matrix type is typically used in small displays and for illumination, since it is not suitable for large high-resolution displays.

In OLEDs, when electrons and holes recombine in the light-emitting layer, the possibility of the generation singlet excitons is limited due to the dependence of the spin statistics. Therefore, the maximum luminous efficiency of OLEDs is merely about 25%.

In addition, in OLEDs, light loss is caused by total reflection at the interface between a thin-film layer and a substrate of each OLED. Thus, the actual light extraction efficiency is merely about 20%, which is problematic.

Accordingly, a variety of studies are underway in order to improve the low light extraction efficiency of OLEDs.

In particular, methods of coating a substrate with a light-scattering layer which includes scattering particles are generally used. Specifically, the light-scattering layer is formed by impregnating metal oxide particles in a matrix material such that the metal oxide particles are used as scattering particles. Then, a light-scattering effect can be obtained at the interface of the metal oxide particles due to different refractive indices.

The light-scattering layer is formed by a wet coating method, such as spin coating or bar coating. According to this method, however, it is difficult to uniformly disperse the metal oxide particles inside the matrix. Due to the characteristics of the wet coating, during the baking of the liquid matrix, the volume of the matrix is reduced by about ⅕ to about 1/20, which is problematic.

The information disclosed in the Background of the Invention section is provided only for enhancement of (or better) understanding of the background of the invention, and should not be taken as an acknowledgment or any form of suggestion that this information forms a prior art that would already be known to a person skilled in the art.

RELATED ART DOCUMENT

Patent Document 1: Japanese Patent No. Sho 62-172691 (Jul. 29, 1987)

BRIEF SUMMARY OF THE INVENTION

Various aspects of the present invention provide a method of fabricating a light-scattering substrate, a light-scattering substrate fabricated by the same method, and an organic light-emitting device (OLED) including the same light-scattering substrate, in which a light-scattering layer of the light-scattering substrate can improve a light extraction efficiency.

In an aspect of the present invention, provided is a method of fabricating a light-scattering substrate by chemical vapor deposition. The method includes the following steps of: loading a base substrate into a chamber; and forming a light-scattering layer on the base substrate by supplying a Ti source and an oxidizer including $H_2O$ into the chamber. In the process of forming the light-scattering layer, the mole ratio of the $H_2O$ with respect to the Ti is 10 or greater.

According to an embodiment of the present invention, the oxidizer may further include at least one selected from the group consisting of $O_2$, $O_3$ and alcohol.

The Ti source may be titanium tetra isopropoxide (TTIP, $Ti\{OCH(CH_3)_2\}_4]$ or $TiCl_4$.

The step of forming the light-scattering layer may be carried out when a temperature of the base substrate ranges from 200 to 350° C.

The step of forming the light-scattering layer may include forming $TiO_2$ particles and a $TiO_2$ thin film which bonds the $TiO_2$ particles to the base substrate.

The method may further include forming a planarization layer on the light-scattering layer after the step of forming the light-scattering layer. The planarization layer may be made of one selected from the group consisting of $SiO_2$, $TiO_2$ and polymer resin.

In another aspect of the present invention, provided is a light-scattering substrate that includes: a base substrate; a number of $TiO_2$ particles disposed on the base substrate; and a $TiO_2$ thin film which coats an upper surface of the base substrate and bonds the number of $TiO_2$ particles to the base substrate.

The particle size of the $TiO_2$ particles may range from 200 to 1000 nm, and the thickness of the $TiO_2$ thin film may range from 10 to 100 nm.

The light-scattering substrate may further include a planarization layer disposed on the number of $TiO_2$ particles and the $TiO_2$ thin film. The planarization layer may be made of one selected from the group consisting of $SiO_2$, $TiO_2$ and polymer resin.

In a further aspect of the present invention, provided is an OLED including the above-mentioned light-scattering substrate.

According to embodiments of the present invention, it is possible to uniformly coat a substrate with light-scattering $TiO_2$ particles at a high volume percent, thereby improving the light extraction efficiency of the substrate.

In addition, it is possible to form a light-scattering layer by a single process of chemical vapor deposition (CVD), thereby improving the productivity of the formation of the light-scattering layer.

The methods and apparatuses of the present invention have other features and advantages which will be apparent from, or are set forth in greater detail in the accompanying drawings, which are incorporated herein, and in the following Detailed Description of the Invention, which together serve to explain certain principles of the present invention.

DETAILED DESCRIPTION OF THE INVENTION

Figure 1:
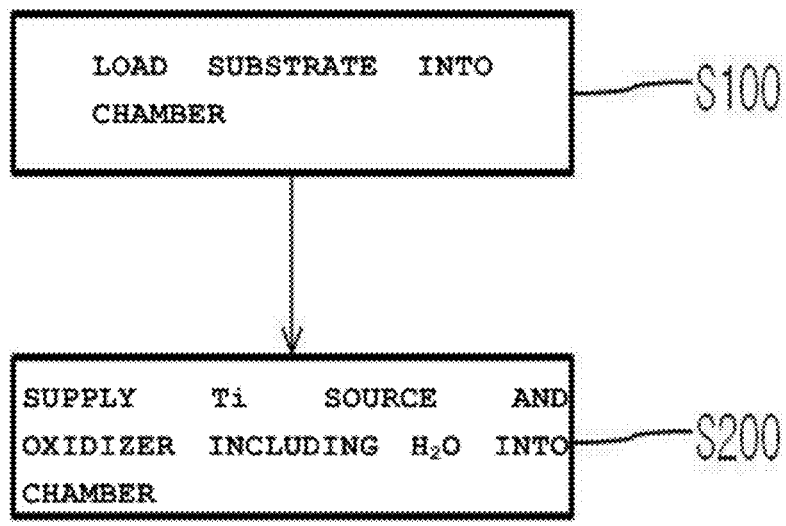
FIG. 1 is a schematic flowchart showing a method of fabricating a light-scattering substrate according to an exemplary embodiment of the present invention.

Reference will now be made in detail to a method of fabricating a light-scattering substrate according to the present invention, a light-scattering substrate fabricated by the same method, and an organic light-emitting device including the same light-scattering substrate, embodiments of which are illustrated in the accompanying drawings and described below, so that a person skilled in the art to which the present invention relates can easily put the present invention into practice.

Throughout this document, reference should be made to the drawings, in which the same reference numerals and signs are used throughout the different drawings to designate the same or similar components. In the following description of the present invention, detailed descriptions of known functions and components incorporated herein will be omitted when they may make the subject matter of the present invention unclear.

Figure 2:
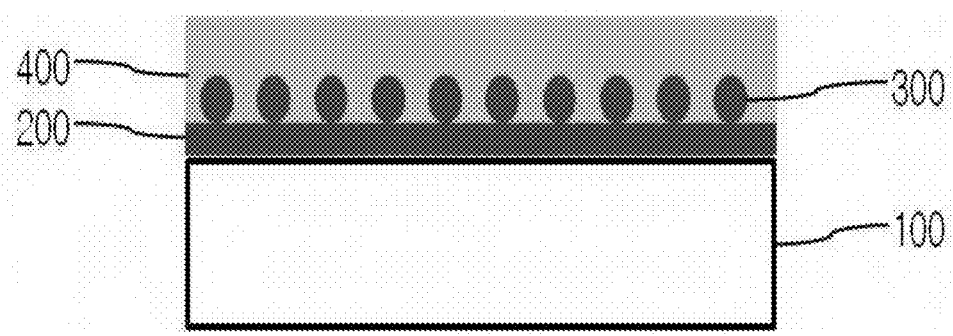
FIG. 2 is a conceptual cross-sectional view showing a light-scattering substrate according to an exemplary embodiment of the present invention.

FIG. 1 is a schematic flowchart showing a method of fabricating a light-scattering substrate according to an exemplary embodiment of the present invention, and FIG. 2 is a conceptual cross-sectional view showing a light-scattering substrate according to an exemplary embodiment of the present invention.

The method of fabricating a light-scattering substrate according to this exemplary embodiment is the method of forming a light-scattering layer on a substrate by chemical vapor deposition (CVD). As shown in FIG. 1, the method includes a substrate loading step and a light-scattering layer forming step.

In order to fabricate a light-scattering substrate, first, a base substrate 100 is loaded into a chamber at S100.

The base substrate 100 can be implemented as any transparent substrate that has superior light transmittance and superior mechanical properties. For instance, the base substrate 100 can be made of a polymeric material, such as a thermally or ultraviolet (UV) curable organic film, or a chemically strengthened glass of, for example, soda-lime ($SiO_2$—CaO—$Na_2O$) or aluminosilicate ($SiO_2$—$Al_2O_3$—$Na_2O$). The amount of Na can be adjusted as required. When the OLED is used for illumination, the base substrate 100 can be made of soda-lime glass. When the OLED is used in a display, the base substrate 100 can be made of aluminosilicate glass.

According to this embodiment, the base substrate 100 can be made of a piece of thin glass having a thickness of 1.5 mm or less. The thin glass can be made using a fusion process or a floating process.

Afterwards, at S200, a titanium (Ti) source gas and an oxidizer gas that includes $H_2O$ are supplied into the chamber, forming a light-scattering layer on the base substrate. The mole ratio of $H_2O$ with respect to Ti supplied on the Ti source gas is 10 or greater.

It is preferred that the Ti source gas and the oxidizer gas be supplied into the chamber through separate nozzles in order to prevent the gases from reacting with each other before being blown into the chamber.

When the Ti source gas and the oxidizer gas are blown into the chamber, the Ti source reacts with the oxidizer, thereby forming a $TiO_2$ thin film on the base substrate. The reactivity of $H_2O$ in the oxidizer to the Ti source is very high compared to the other oxidizer matters. Thus, if a predetermined amount $H_2O$ or greater is blown into the chamber, $H_2O$ can react with the Ti source, thereby forming a number of $TiO_2$ particles that is not adhesive to the base substrate.

Accordingly, the Ti source and the oxidizer that includes $H_2O$ are prepared such that a mole ratio of $H_2O$ with respect to Ti is 10 or greater, and are concurrently blown at this mole ratio into the chamber, so that $TiO_2$ particles produced through the reaction between $H_2O$ included in the oxidizer and the Ti source are bonded to the base substrate by means of the $TiO_2$ thin film that is formed on the base substrate through the reaction between the oxidizer and the Ti source.

Thus, as shown in FIG. 2, it is possible to fabricate a light-scattering substrate that includes the base substrate 100, a number of $TiO_2$ particles 300 formed on the base substrate 100, and a $TiO_2$ thin film 200 which coats the top surface of the base substrate 100 and bonds the $TiO_2$ particles 300 to the base substrate 100.

It is preferred that the particle size of the $TiO_2$ particles 300 range from 200 to 1000 nm, and that the thickness of the $TiO_2$ thin film 200 range from 10 to 100 nm.

The oxidizer may further include, in addition to $H_2O$, at least one selected from among $O_2$, $O_3$ and alcohol.

The Ti source may be implemented as titanium tetra isopropoxide [TTIP, Ti{OCH$(CH_3)_2$}$_4$] or $TiCL_4$. In particular, TTIP has been used for forming a $TiO_2$ thin film through a reaction with an oxidizer although it acts as a metal oxide source that decomposes itself at high temperature to form $TiO_2$. TTIP has high reactivity with $H_2O$.

It is preferred that the light-scattering layer forming step S200 be carried out when the temperature of the base substrate ranges from 200 to 350° C. The light-scattering layer forming step S200 TTIP also be carried out when the temperature inside the chamber ranges from 300 to 500° C.

When the light-scattering layer is formed on the base substrate according to this exemplary embodiment, the base substrate can be coated with light-scattering $TiO_2$ particles at a high volume percent. This can consequently improve the light extraction efficiency.

A conventional method of forming $TiO_2$ particles on the base substrate includes dispersing $TiO_2$ particles in a $SiO_2$ solution, coating the base substrate with the resultant solution, and then baking and sintering the coating. However, this method has a drawback in that a preset amount of $TiO_2$ particles or greater cannot be put into the $SiO_2$ solution in order to uniformly disperse the $TiO_2$ particles. In contrast, according to the present invention, the $TiO_2$ particles are formed in the vapor phase and then bonded to the base substrate. The dispersion of the $TiO_2$ particles is not required, and thus more $TiO_2$ particles can be bonded to the base substrate, thereby improving the light extraction efficiency.

In addition, when the light-scattering layer is formed on the base substrate according to this exemplary embodiment, it is possible to improve the productivity of the formation of the light-scattering layer.

That is, the conventional method has the drawback of the poor productivity of the formation of the light-scattering layer since a multiplicity of processes, such as dispersion, baking and sintering, must be carried out in order to form the light-scattering layer. In contrast, the present invention can improve the productivity of the formation of the light-scattering layer by forming the light-scattering layer by a single process of CVD.

The method of fabricating a light-scattering substrate according to this exemplary embodiment can further include the step of forming a planarization layer 400 on the light-scattering layer 200 and 300 after the light-scattering layer forming step S200.

The planarization layer 400 refers to the layer that planarizes the upper surface of the light-scattering layer 200 and 300 in order to form an electrode, an organic light-emitting layer, or the like of the OLED on top of the light-scattering layer 200 and 300.

The planarization layer 400 can be made of one selected from the group consisting of, but not limited to, $SiO_2$, $TiO_2$ and polymer resin.

Figure 3:
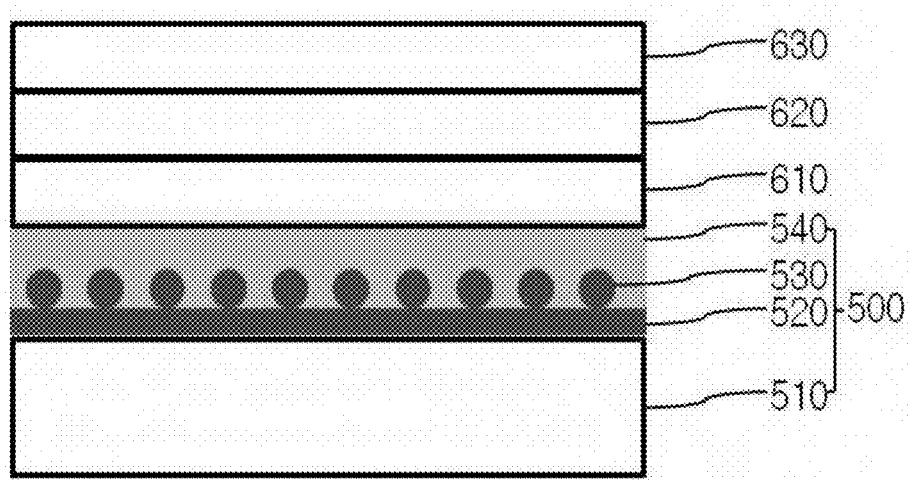
FIG. 3 is a conceptual cross-sectional view showing an organic light-emitting device (OLED) including a light-scattering substrate according to an exemplary embodiment of the present invention.

FIG. 3 is a conceptual cross-sectional view showing an OLED including the above-described light-scattering substrate.

A light-scattering substrate 500 according to an exemplary embodiment of the present invention is one substrate of a pair of substrates which are disposed on both sides of an OLED such that the two substrates face each other, more particularly, the one substrate which is disposed on one surface of the OLED through which light generated from the OLED is emitted outward. When the light-scattering substrate according to this exemplary embodiment is used in a bottom emission type OLED, the substrate can be a panel substrate that faces an anode 610 of the OLED. When the light-scattering substrate according to this exemplary embodiment is used in a top emission type OLED, the light-scattering substrate can be an encapsulation glass substrate that faces a cathode 630 of the OLED. The light-scattering substrate 500 can include a base substrate 510, a number of $TiO_2$ particles 530, a $TiO_2$ thin film 520 which bonds the $TiO_2$ particles 530 to the base substrate 510, and a planarization layer 540. Here, the light-scattering layer 520 and 530, in particular, the $TiO_2$ particles 530 serve to scatter light generated from an organic light-emitting layer 620, thereby increasing the amount of light that is extracted.

The anode 610, the organic light-emitting layer 620 and the cathode 630 are disposed between the light-scattering substrate 500 and an encapsulation substrate (not shown) that faces the substrate 500.

The anode 610 can be made of a metal, such as gold (Au), indium (In), tin (Sn), or an oxide, such as indium tin oxide (ITO), which has a significant work function in order to facilitate the hole injection. The cathode 630 can be made of a metal thin film of, for example, Al, Al:Li or Mg:Ag, which has a smaller work function in order to facilitate the electron injection. In a top emission type OLED, the cathode 630 can have a multilayer structure that includes a semitransparent electrode of a metal thin film made of Al, Al:Li or Mg:Ag and a transparent electrode of an oxide thin film made of, for example, ITO in order to facilitate the transmission of light generated from the organic light-emitting layer 620. The organic light-emitting layer 620 includes a hole injection layer, a hole transport layer, an emissive layer, an electron transport layer and an electron injection layer which are sequentially stacked on the anode 610. With this structure, when a forward voltage is induced between the anode 610 and the cathode 630, electrons from the cathode 630 migrate to the organic light-emitting layer 620 through the electron injection layer and the electron transport layer, and holes from the anode 610 migrate to the organic light-emitting layer 620 through the hole injection layer and the hole transport layer. The electrons and holes that have migrated into the organic light-emitting layer 620 recombine with each other, thereby generating excitons. When these excitons transit from an excited state to a ground state, light is emitted. The brightness of the light emitted is proportional to the amount of current that flows between the anode 610 and the cathode 630.

The foregoing descriptions of specific exemplary embodiments of the present invention have been presented with respect to the drawings. They are not intended to be exhaustive or to limit the present invention to the precise forms disclosed, and obviously many modifications and variations are possible for a person having ordinary skill in the art in light of the above teachings.

It is intended therefore that the scope of the present invention not be limited to the foregoing embodiments, but be defined by the Claims appended hereto and their equivalents.

What is claimed is:

1. A method of fabricating a light-scattering substrate of an organic light emitting device, the method comprising:
   loading a base substrate into a chamber; and
   forming a light-scattering layer on the base substrate by chemical vapor deposition such that the light-scattering layer is disposed between the base substrate and an organic light-emitting layer of the organic light emitting device, by supplying a Ti source and an oxidizer including $H_2O$ into the chamber, thereby producing the light-scattering substrate of the organic light emitting device scattering light generated by the organic light emitting layer, while the light is emitted outward through the light scattering substrate, wherein, in the process of forming the light-scattering layer, a mole ratio of the $H_2O$ with respect to the Ti is 10 or greater.

2. The method according to claim 1, wherein the oxidizer further includes at least one selected from the group consisting of $O_2$, $O_3$ and alcohol.

3. The method according to claim 1, wherein the Ti source comprises $Ti\{OCH(CH_3)_2\}_4$ or $TiCl_4$.

4. The method according to claim 1, wherein forming the light-scattering layer is carried out when a temperature of the base substrate ranges from 200 to 350° C.

5. The method according to claim 1, wherein forming the light-scattering layer comprises forming $TiO_2$ particles and a $TiO_2$ thin film which bonds the $TiO_2$ particles to the base substrate.

6. The method according to claim 1, further comprising forming a planarization layer on the light-scattering layer after forming the light-scattering layer.

7. The method according to claim 6, wherein the planarization layer is made of one selected from the group consisting of $SiO_2$, $TiO_2$ and polymer resin.

\* \* \* \* \*